United States Patent
Lin et al.

(10) Patent No.: US 8,540,506 B2
(45) Date of Patent: Sep. 24, 2013

(54) SEMICONDUCTOR MOLDING CHAMBER

(75) Inventors: Jing-Cheng Lin, Hsin-Chu (TW);
Wen-Chih Chiou, Miaoli (TW);
Shin-Puu Jeng, Hsin-Chu (TW);
Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 311 days.

(21) Appl. No.: 12/857,245

(22) Filed: Aug. 16, 2010

(65) Prior Publication Data
US 2012/0040500 A1    Feb. 16, 2012

(51) Int. Cl.
*H01L 21/56* (2006.01)

(52) U.S. Cl.
USPC ........................................ 425/405.1

(58) Field of Classification Search
CPC ............................ H01L 21/561; H01L 21/565
USPC ........................................ 425/405.1
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,093,583 A | 7/2000 | Mukerji et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,383,846 B1 | 5/2002 | Shen et al. | |
| 6,434,016 B2 | 8/2002 | Zeng et al. | |
| 6,448,661 B1 | 9/2002 | Kim et al. | |
| 6,459,159 B1 | 10/2002 | Miyagawa et al. | |
| 6,461,895 B1 | 10/2002 | Liang et al. | |
| 6,511,620 B1 | 1/2003 | Kawahara et al. | |
| 6,530,764 B2 | 3/2003 | Mishima et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |

(Continued)

*Primary Examiner* — Yogendra Gupta
*Assistant Examiner* — Alison Hindenlang
(74) *Attorney, Agent, or Firm* — Slater & Matsil, L.L.P.

(57) ABSTRACT

A system and method for a semiconductor molding chamber is disclosed. An embodiment comprises a top molding portion and a bottom molding portion that form a cavity between them into which a semiconductor wafer is placed. The semiconductor molding chamber has a first set of vacuum tubes which hold and fix the position of the semiconductor wafer and a second set of vacuum tubes which evacuate the cavity of extraneous ambient gasses. The encapsulant may then be placed over the semiconductor wafer in order to encapsulate the semiconductor wafer.

20 Claims, 10 Drawing Sheets

(56) References Cited

U.S. PATENT DOCUMENTS

| | | |
|---|---|---|
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,407,608 B2 | 8/2008 | Miyajima et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2006/0055080 A1 | 3/2006 | Pham et al. |
| 2007/0246853 A1 | 10/2007 | Chey et al. |
| 2008/0038873 A1* | 2/2008 | Tanida .......................... 425/116 |

* cited by examiner

SEMICONDUCTOR MOLDING CHAMBER

TECHNICAL FIELD

The present embodiments relate generally to a system and method for manufacturing semiconductor devices and, more particularly, to a system and method for encapsulating semiconductor dies.

BACKGROUND

Generally, once a semiconductor wafer has gone through the front end of line and back end of line processing to form semiconductor devices and their respective connections, the semiconductor wafer is coated with, e.g., a resin in order to further protect the semiconductor wafer from physical and environmental damage. In order to get the resin into a desired shape the semiconductor wafer is placed into a molding chamber (usually with a special release film that keeps the wafer from adhering to the molding chamber) and the resin is injected into the molding chamber such that the molding chamber molds the resin into the desired shape over the semiconductor wafer.

However, when a resin is injected into the chamber with the semiconductor wafer merely resting (or "floating") on the release film, an undesired accumulation of resin, known as "flash," may occur along the backside of the semiconductor wafer. This flash can cause several destructive issues and can interfere with the operation of the semiconductor wafer. For example, the flash, being a dielectric material, can cover conductive contacts and prevent them from conducting power and/or signals into and out of the semiconductor wafer. Additionally, flash accumulation may also interfere by destroying the planarity of the backside of the semiconductor wafer, and could prevent the proper placement and alignment of the semiconductor wafer during connection with external devices.

SUMMARY

These and other problems are generally solved or circumvented, and technical advantages are generally achieved, by embodiments which provide for a system and method for encapsulating a semiconductor device.

In accordance with an embodiment, a system for encapsulating a semiconductor device comprises a molding chamber, the molding chamber comprising a first variable pressure region, a second variable pressure region, and a semiconductor wafer receiving region located between the first variable pressure region and the second variable pressure region. At least one first vacuum hole extends through the molding chamber, the at least one first vacuum hole opening to the first variable pressure region, and at least one second vacuum hole extends through the molding chamber and is located opposite the semiconductor wafer receiving region from the second variable pressure region and operably connected to the second variable pressure region.

In accordance with another embodiment, a system for encapsulating a semiconductor device comprises a mold defined by a top molding portion and a bottom molding portion. A first vacuum separator and a second vacuum separator are located on one of the bottom molding portion and the top molding portion. A first vacuum hole extends through the mold and is operably connected to control a first pressure in a first pressure zone, the first pressure zone enclosed by the first vacuum separator. A second vacuum hole extends through the mold and is operably connected to control a second pressure in a second pressure zone, the second pressure zone being connected to the second vacuum hole through openings in the second vacuum separator.

In accordance with yet another embodiment, a method for encapsulating a semiconductor device, the method comprises providing a semiconductor device with a top surface and a bottom surface and positioning the bottom surface adjacent to a first mold portion. The pressure along the bottom surface is reduced to affix the bottom surface to the first mold portion. A second mold portion is positioned over the first mold portion and the semiconductor device, the second mold portion and the top mold portion defining a cavity enclosing the semiconductor device. Gasses adjacent to the top surface of the semiconductor device are evacuated through a vacuum hole facing the bottom surface, and an encapsulant is applied to the top surface of the semiconductor device.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of embodiments are discussed in detail below. It should be appreciated, however, that these embodiments provide many applicable inventive concepts that can be embodied in a wide variety of specific contexts. The specific embodiments discussed are merely illustrative of specific ways to make and use the embodiments, and do not limit the scope of the embodiments.

Embodiments will be described with respect to a specific context, namely a molding chamber for encapsulating semiconductor wafers and dies. The embodiments may also be applied, however, to other molding chambers.

Figure 1A:
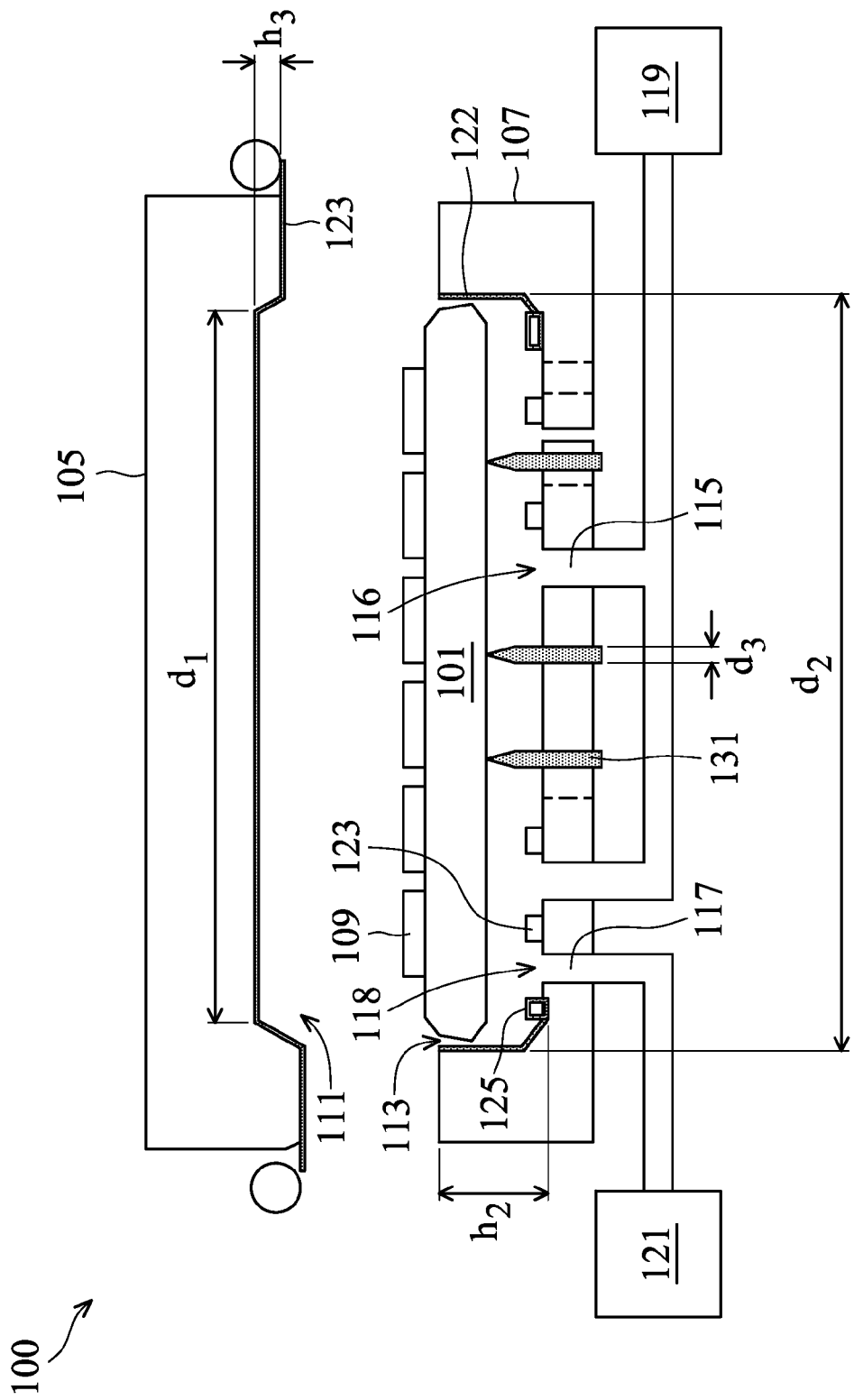
FIGS. 1A-1B illustrate a molding device used to encapsulate a semiconductor wafer in accordance with an embodiment.
Figure 1B:
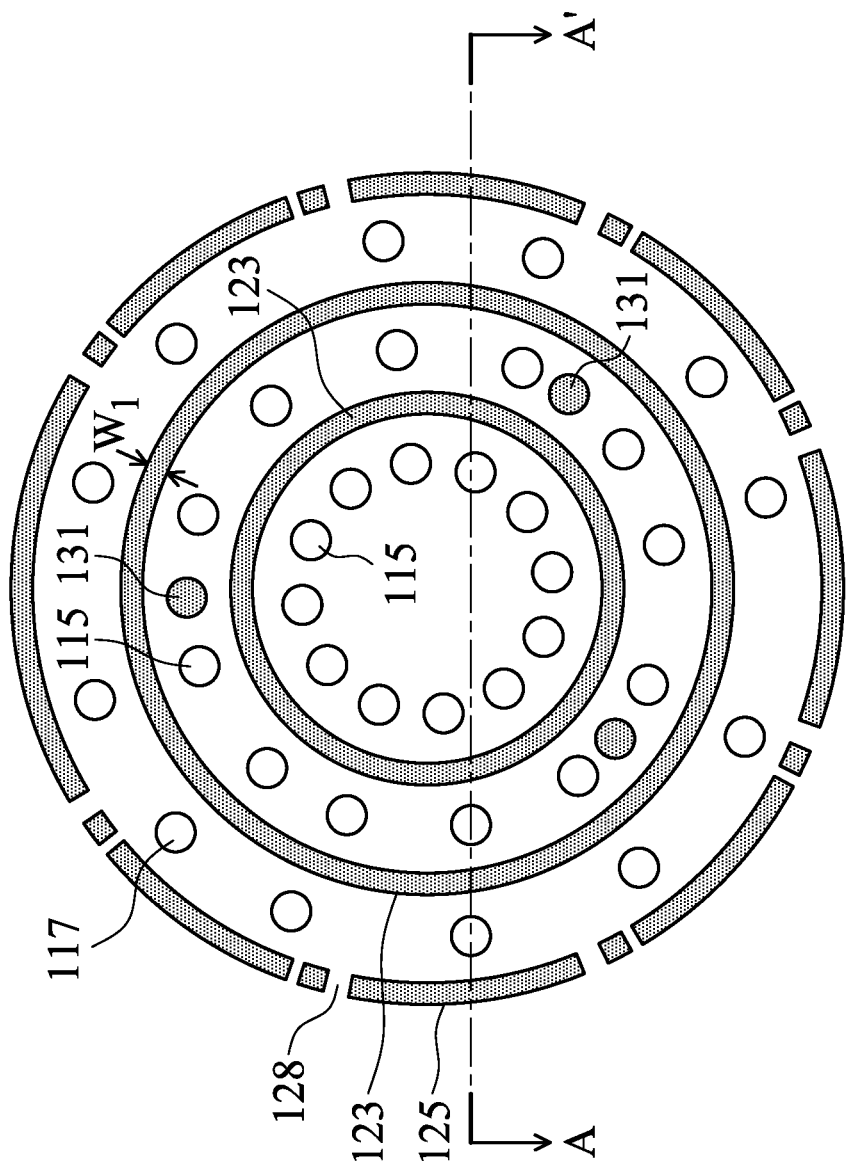

With reference now to FIGS. 1A and 1B, there is shown a molding device 100 used to encapsulate a semiconductor wafer 101 bonded to one or more semiconductor dies 109, with FIG. 1A being a cross-sectional view of FIG. 1B taken along line A-A'. The semiconductor wafer 101 generally comprises a substrate having electronic devices (not shown) formed thereon as is known in the art. The substrate and electronic devices may be covered with one or more dielectric layers and conductive layers. The conductive layers provide connectivity and routing for the underlying electronic devices. The semiconductor wafer 101 may have, e.g., a diameter of between about 300 mm.

The semiconductor dies 109 generally also comprise another substrate having other electronic devices (not shown) formed thereon and separated from a manufacturing wafer as is known in the art. In the embodiment shown in FIG. 1A, the semiconductor dies 109 are bonded to the semiconductor wafer 101 in a die-to-wafer bonding process. In such a process, the semiconductor dies 109 and semiconductor wafer 101 are physically and electrically bonded together through, for example, the use of microbumps (not shown) located between the semiconductor substrate 101 and the semiconductor dies 109. This process may include, e.g., the placement or formation of microbumps on either the semiconductor dies 109 or semiconductor wafer 101, the alignment of the semiconductor dies 109 and the semiconductor wafer 101, and a reflow process to reflow the microbumps to form stable electrical and physical bonds between the semiconductor dies 109 and the semiconductor wafer 101. Other suitable bonding processes, such as wafer-to-wafer bonding, die-to-die bonding, or the like, may alternatively be utilized with the present embodiments, and all such suitable processes are fully intended to be included within the scope of the present invention.

The molding device 100 may comprise a top molding portion 105 and a bottom molding portion 107 separable from the top molding portion 105. The top molding portion 105 may have a first cavity 111 while the bottom molding portion 107 may have a second cavity 113. When the top molding portion 105 is lowered to be adjacent to the bottom molding portion 107, the first cavity 111 and the second cavity 113 may fit together to form a molding cavity 305 for the semiconductor wafer 101 (not shown in FIG. 1A but illustrated below in FIG. 3). Accordingly, while the shape of the first cavity 111 and the second cavity 113 will be influenced by the size and shape of the semiconductor wafer 101, as an example only, the first cavity 111 may have a first diameter $d_1$ sufficient to house the semiconductor wafer 101 and to form the dimensions of the encapsulant 300. For example, the first diameter $d_1$ may be as between about 300 mm and about 301.2 mm, such as between about 300.3 mm to 300.6 mm, and a first height $h_1$ of less than about 2 mm. Similarly, the second cavity may have a second diameter $d_2$ also sized to house the semiconductor wafer 101 and to form the dimensions of the encapsulant 300, such as between about 300 mm and about 300.6 mm or between about 300.3 to 300.4 mm, and a second height $h_2$ of between about 0.6 mm and about 2 mm, such as about 0.6 and 0.8 mm.

The bottom molding portion 107 may have a first set of vacuum holes 115 and a second set of vacuum holes 117. The first set of vacuum holes 115 may be connected to a first vacuum pump 119 in order to reduce the pressure and generate at least a partial vacuum within the first set of vacuum holes 115. When the semiconductor wafer 101 is placed adjacent to the first set of vacuum holes 117, this at least partial vacuum will lower the pressure in a first variable pressure zone 116 in order to fix and hold the semiconductor wafer 101, thereby assuring that, once the semiconductor wafer 101 is correctly positioned within the first cavity 111, the semiconductor wafer 101 will not move during subsequent processing, such as the encapsulation process.

The second set of vacuum holes 117 may be connected to a second vacuum pump 121 in order to reduce the pressure and generate at least a partial vacuum within the second set of vacuum holes 117. Once the bottom molding portion 107 has been lowered into connection with the top molding portion 105 (see FIG. 3 below), the at least partial vacuum within the second set of vacuum holes 117 may be used to lower the pressure in a second variable pressure zone 118 and also evacuate the molding cavity 305. By evacuating the ambient gasses from the molding cavity 305, the second set of vacuum holes 117 can help prevent the accumulation of flash material along the backside of the semiconductor wafer 101.

However, as one having ordinary skill in the art will immediately recognize, the above description of connections between the first set of vacuum holes 115, the second set of vacuum holes 117, the first vacuum pump 119, and the second vacuum pump 121 is meant to be illustrative only, and is not intended to limit this embodiment. Alternatively, a single vacuum pump may be connected to both the first set of vacuum holes 115 and the second set of vacuum holes 117, with the single vacuum pump providing the vacuum to both fix and hold the semiconductor wafer 101 as well as evacuate the first cavity 111 and second cavity 113. This alternative and any other suitable arrangement of connections are fully intended to be included within the scope of the current embodiments.

Figure 3:
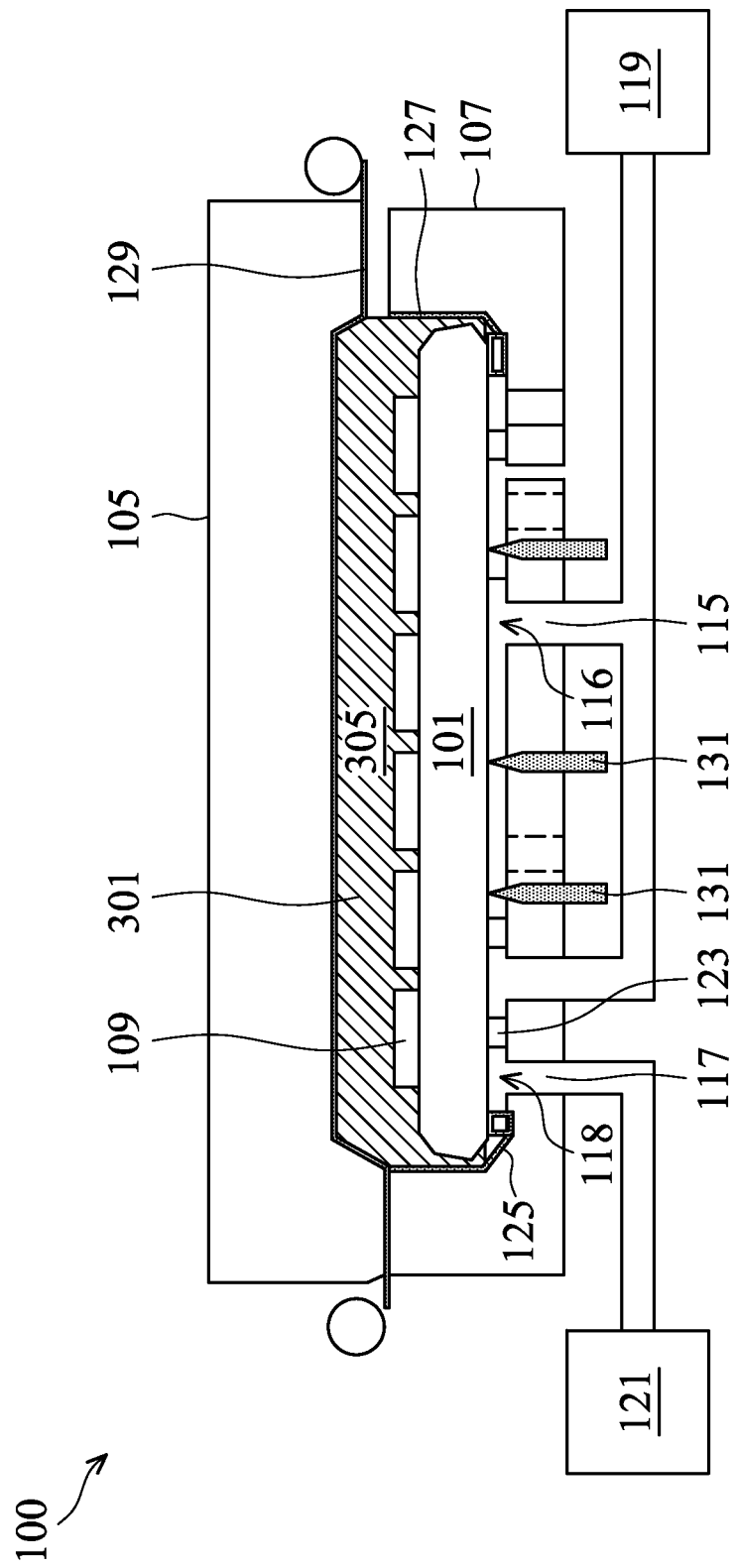
FIG. 3 illustrates encapsulation of the semiconductor device in accordance with an embodiment.

Additionally, FIGS. 1A and 1B illustrate first vacuum separators 123 and second vacuum separators 125. The first vacuum separators 123 (along with the semiconductor wafer 101 as illustrated in FIG. 3 below) separate the areas evacuated by the first set of vacuum holes 115 from the areas evacuated by the second set of vacuum holes 117. By separating the areas evacuated by the first set of vacuum holes 115 from the areas evacuated by the second set of vacuum holes 117, the first set of vacuum holes 115 may be operated separately from the second set of vacuum holes 117 and the semiconductor wafer 101 may be fixed and held separately from the evacuation of the molding cavity 305. This separation may be especially useful when it is desired to fix and hold the semiconductor wafer 101 when the top molding portion 105 is separated from the bottom molding portion 107 (thereby breaking any partial vacuum in the remainder of the molding cavity 305).

The first vacuum separators 123 may be situated in concentric rings at spaced apart intervals of between about 10 mm and about 50 mm, such as about 25 mm. The first vacuum separators 123 may be have a width $w_1$ of between about 1 mm and about 10 mm, such as about 5 mm. The first vacuum separators 123 may be a single uninterrupted piece in order to promote an air-tight seal between the semiconductor wafer 101 and the first vacuum separators 123 when the first vacuum pump 119 is engaged. However, these characteristics are meant to be illustrative only, and any other suitable arrangement of openings that allow for the fixing and adhering of the semiconductor wafer 101.

The second vacuum separators 125, while being located on the bottom molding portion 107, maintains openings 128 (see FIG. 1B) which allow for the passage of gasses from the molding cavity 305 to the second set of vacuum holes 117. These openings 128 may be used, along with the second vacuum pump 121, to evacuate the gasses from the molding cavity 305 during the encapsulation process.

The second vacuum separators 125 may have, for example, a total of six openings 128 placed at regular intervals around the concentric ring of the second vacuum separator 125. As such, the second vacuum separators 125 may have openings of between about 1 mm and about 20 mm, such as about 5 mm, and may be placed every 5° to 120°, such as about every 60°. However, these characteristics are meant to be illustrative only, and any other suitable arrangement of openings that allow for the removal of gasses from the molding cavity 305 may alternatively be used.

Additionally, the first vacuum separators 123 and second vacuum separators 125 may be placed in concentric rings (shown in FIG. 1B) and may work together to separate the semiconductor wafer 101 from the first set of vacuum holes 115 and the second set of vacuum holes 117. By separating the semiconductor wafer 101 from the first set of vacuum holes 115 and the second set of vacuum holes 117, the first vacuum separators 123 and second vacuum separators 125 also prevent the semiconductor wafer 101 from blocking the second set of vacuum holes 117 and stopping the evacuation of gases from the molding cavity 305.

The sidewalls of the second cavity 113 and/or the second vacuum separators 125 may be coated with a release material 127. This release material 127 is intended to provide a non-adhering surface for the encapsulating material (described more fully below with reference to FIG. 3), so that, once the semiconductor wafer 101 is encapsulated, the semiconductor wafer 101 can be easily removed from the second cavity 113 without adhering to the sidewalls of the second cavity 113. The release material 127 may be, for example, gold, Teflon, Cr—N, combinations of these, or the like, although any suitable release material 127 may alternatively be utilized.

Also illustrated in FIG. 1A is a release film 129 positioned to be located between the top molding portion 105 and the semiconductor wafer 101. The release film 129 may be a material that allows the encapsulant to not stick, or be released from, the surface of the first cavity 111 once the semiconductor wafer 101 has gone through the encapsulating process. The release film 129 may comprise polyimide, vinyl chloride, PC, ETFE, PTFE, PET, FEP, polyvinylidene chloride, fluorine-containing glass cloth, synthetic paper, metallic foil, combinations of these, and the like. The release film 129 may have a thickness between about 20 μm and about 50 μm, such as about 25 μm.

The bottom molding portion 107 may also include ejection pins 131. The ejection pins 131 provide a force that helps to release the semiconductor wafer 101 from the bottom molding portion 107 after encapsulation. There may be, for example, three ejection pins 131 with a third diameter $d_3$ of about 1.5 mm, spaced regularly around the second cavity 113, such as about every 120°. However, these dimensions are meant to be merely illustrative, and any suitable dimension and spacing which allows the ejection pins 131 to eject the semiconductor wafer 101 from the bottom molding portion 107 may alternatively be utilized.

Figure 2:
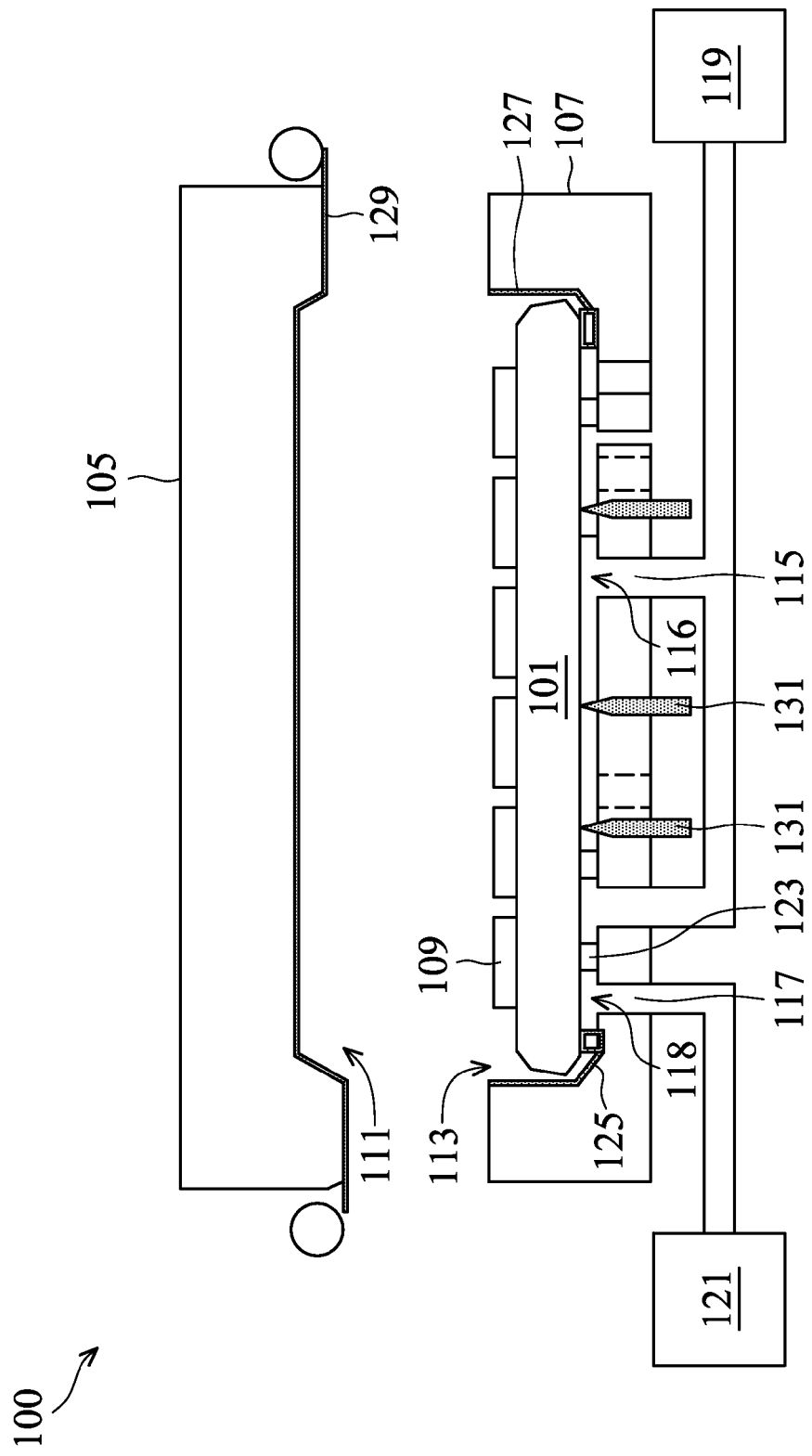
FIG. 2 illustrates affixing of the semiconductor device to the molding device in accordance with an embodiment.

FIG. 2 illustrates the placement of the semiconductor wafer 101 into the second cavity 113 and the engagement of the first set of vacuum holes 115. In an embodiment the semiconductor wafer 101 is positioned over the first set of vacuum holes 115 and the second set of vacuum holes 117, and the first vacuum pump 119 is engaged to reduce the pressure within the first set of vacuum holes 115. With the pressure lowered to at least a partial vacuum, such as about 1 mtorr, the semiconductor wafer 101 is fixed and held against the first vacuum separators 123 and the second vacuum separators 125, and also pushes the ejection pins 131 into a retracted position.

FIG. 3 illustrates the positioning of the top molding portion 105 adjacent to the bottom molding portion 107, thereby enclosing the semiconductor wafer 101 within the molding cavity 305. Once enclosed, the top molding portion 105 and the bottom molding portion 107 (along with the release film 129 sandwiched between them) may form an airtight seal in order to control the influx and outflux of gasses from the molding cavity 305. The top molding portion 105 and the bottom molding portion 107 may be pressed together using, e.g., a compression tool and a force of between about 5 KN and about 200 KN, such as between about 50 and 100 KN.

Also illustrated in FIG. 3 is the placement of an encapsulant 301 within the first cavity 111 and the second cavity 113. The encapsulant 301 may be a resin such as polyimide, PPS, PEEK, PES, a heat resistant crystal resin, combinations of these, or the like. The encapsulant 301 may be placed within the molding cavity 305 prior to the alignment of the top molding portion and the bottom molding portion, or else may be injected into the first cavity 111 and second cavity 113 through an injection port (not shown).

During the encapsulation process, and especially once the encapsulant 301 has been placed within the molding cavity 305, the second vacuum pump 121 may be utilized to create a partial vacuum through the second set of vacuum holes 117, such as between about 1 and 0.001 torr. The partial vacuum works to evacuate any ambient gasses located within the molding cavity 305 through the openings 128 (see FIG. 1A) so that the ambient gasses do not interact and interfere with the encapsulation process. This ambient gas control helps to prevent flash from accumulating along the backside of the semiconductor wafer 101.

Once the encapsulant 301 has been placed into the molding cavity 305 such that the encapsulant 301 encapsulates the semiconductor wafer 101, the encapsulant 301 may be cured in order to harden the encapsulant 301 for optimum protection. While the exact curing process is dependent at least in part on the particular material chosen for the encapsulant 301, in an embodiment in which molding compound is chosen as the encapsulant 301, the curing could occur through a process such as heating the encapsulant 301 to between about 100° C. and about 130° C., such as about 125° C. for about 60 sec to about 3000 sec, such as about 600 sec. Additionally, initiators and/or catalysts may be included within the encapsulant 301 to better control the curing process.

However, as one having ordinary skill in the art will recognize, the curing process described above is merely an exemplary process and is not meant to limit the current embodiments. Other curing process, such as irradiation or even allowing the encapsulant 301 to harden at ambient temperature, may alternatively be used. Any suitable curing process may be used, and all such processes are fully intended to be included within the scope of the embodiments discussed herein.

Figure 4:
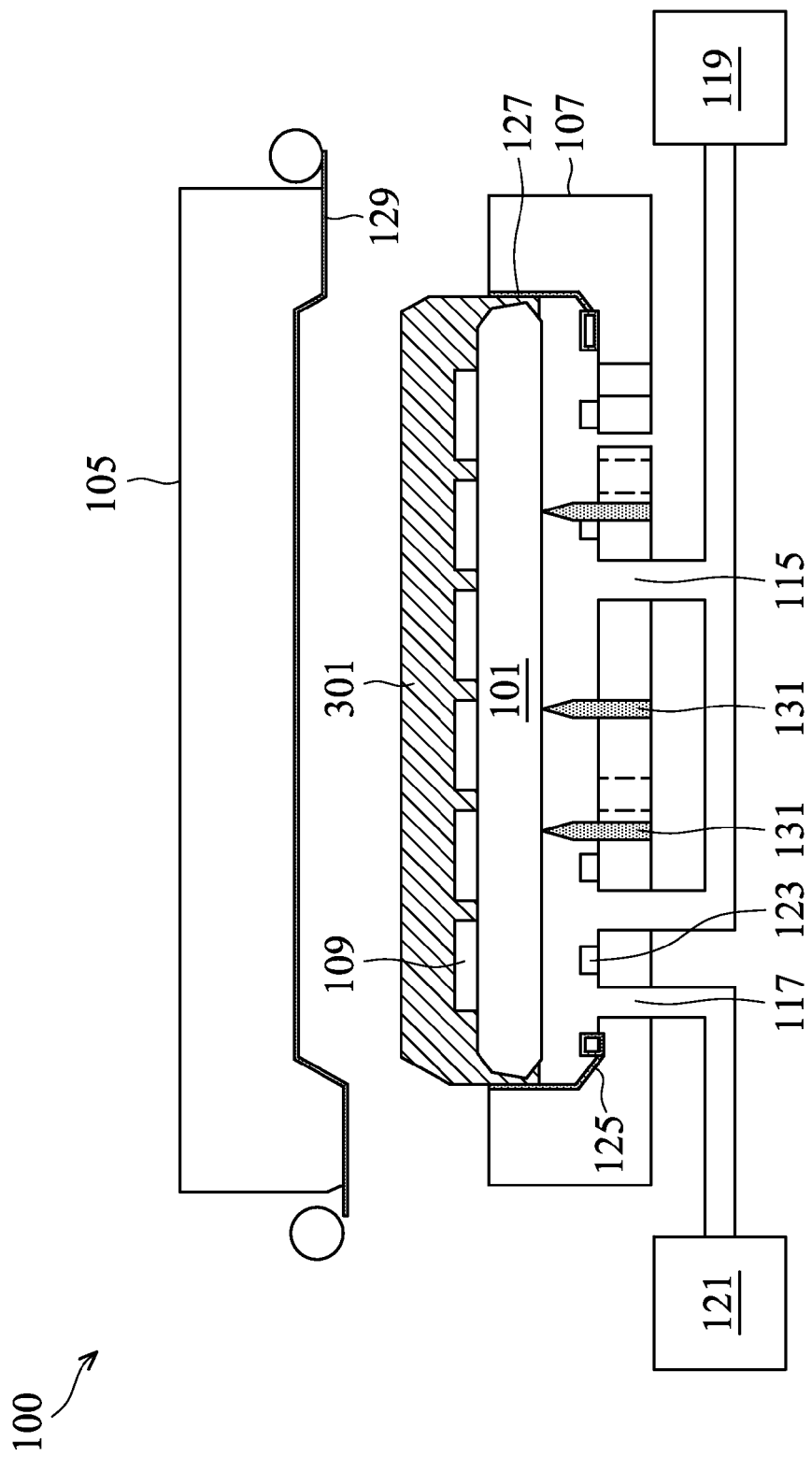
FIG. 4 illustrates removal of the encapsulated semiconductor device in accordance with an embodiment.

FIG. 4 illustrates the separation of the top molding portion 105 and the bottom molding portion 107 after the second vacuum pump 121 has been disengaged, thereby allowing the pressure in the first set of vacuum holes 115 and the second set of vacuum holes 117 to return to ambient pressure. This separation also separates the top molding portion 105 from the semiconductor wafer 101/encapsulant 301 combination, using the release film 129 as an aid to separation so that the semiconductor wafer 101/encapsulant 301 does not stick to the surface of the first cavity 111.

Once the top molding portion 105 has been separated from the bottom molding portion 107, the first vacuum pump 119 may be disengaged, thereby releasing the semiconductor wafer 101, and the ejection pins 131 may be engaged to separate the semiconductor wafer 101/encapsulant 301 combination from the bottom molding portion 107, in order to force the separation of the semiconductor wafer 101/encapsulant 301 and the bottom molding portion 107. The separation is aided by the release material 127 located along the sidewalls of the bottom molding portion 107.

Figure 5A:
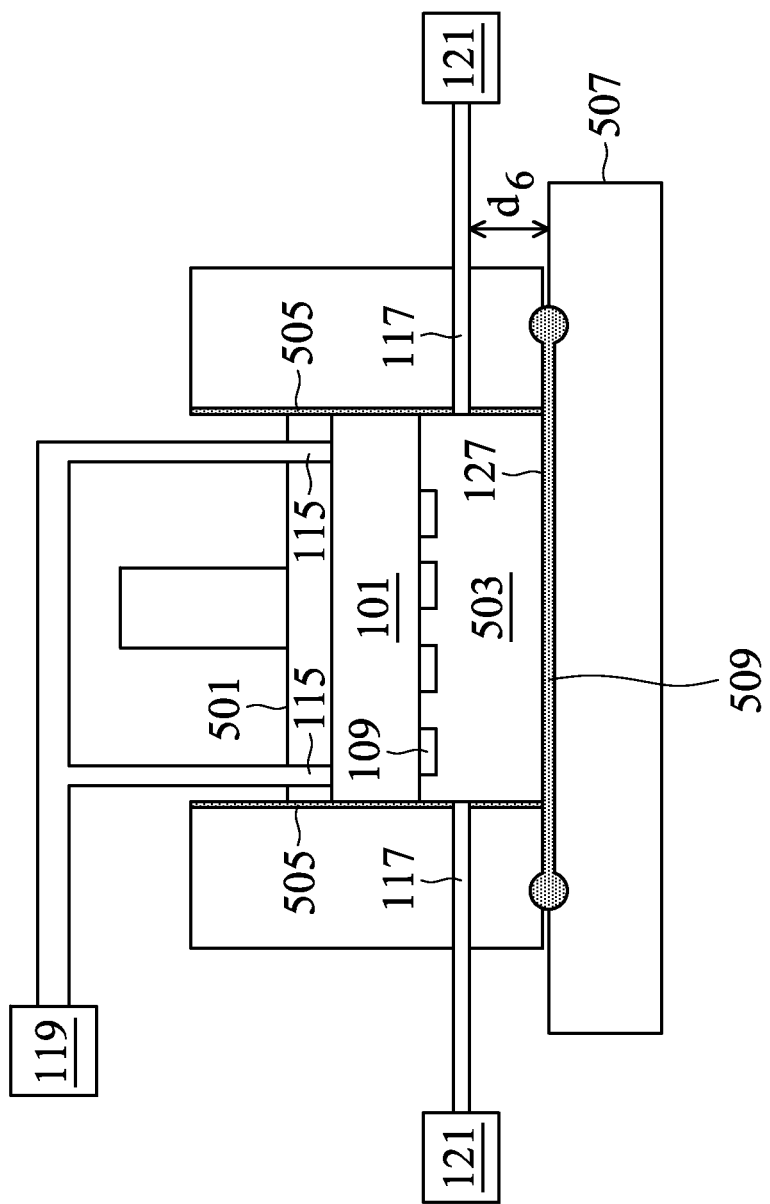
FIGS. 5A-5B illustrate an embodiment in which a piston arrangement is utilized as the molding device.
Figure 5B:
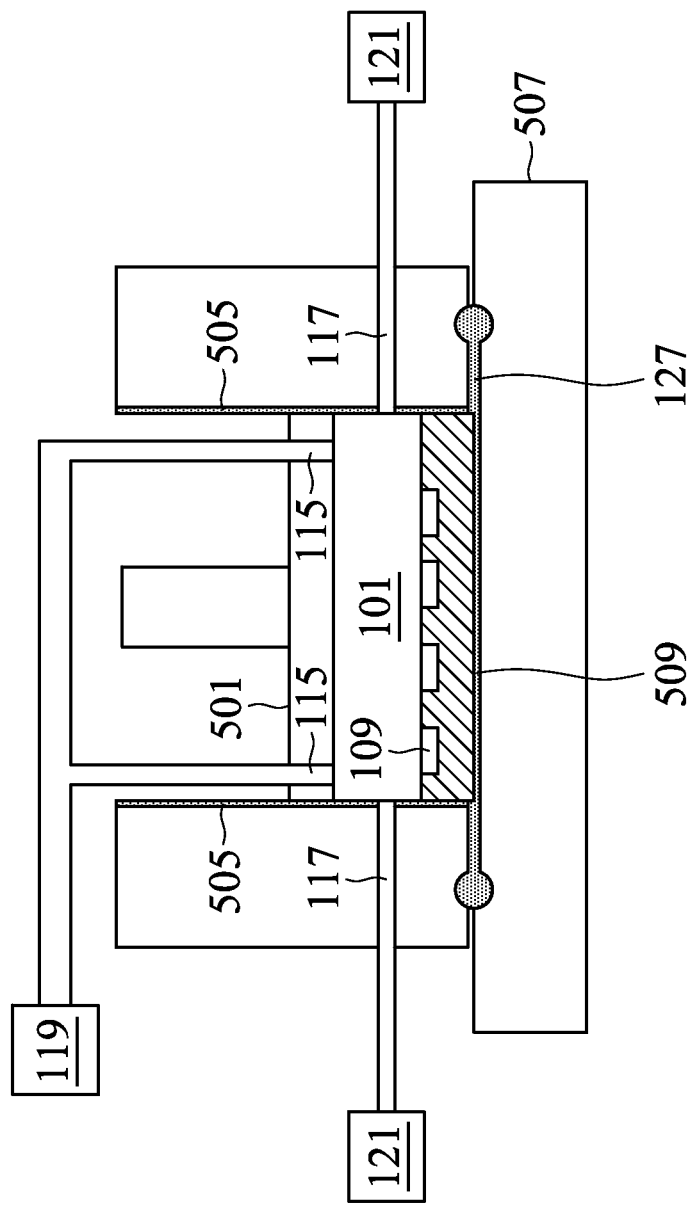

FIGS. 5A and 5B illustrate another embodiment which utilizes a top down mold design. In this embodiment the backside of the semiconductor wafer 101 is affixed to a piston 501. The backside of the semiconductor wafer 101 may be affixed through the use of the first set of vacuum holes 115 that extend through the piston 501 and allow for the first vacuum pump 119 to form a partial vacuum, thereby holding the backside of the semiconductor wafer 101 against the piston 501.

Once affixed to the piston 501, the semiconductor wafer 101 and the piston 501 are lowered into a chamber 503. The chamber 503 may have sidewalls 505 connected to a bottom unit 507 that are separated by, for example, an O-ring 509 located between the sidewalls 505 and bottom unit 507. The sidewalls 505 and bottom unit 509 exposed to the chamber 503 may be coated with the release material 127 (e.g., gold, Teflon, etc.) to aid in preventing the semiconductor wafer 101 and/or encapsulant 301 (see FIG. 5B) from adhering to the sidewalls 505.

In the embodiment shown in FIG. 5A, the second set of vacuum holes 117 extend through the sidewalls 505 of the chamber 503. The second set of vacuum holes 117 and the second vacuum pump 121 (represented in FIG. 5A by two second vacuum pumps 121) may be used to evacuate the chamber 503 once the piston 501 has been placed within the sidewalls 505 of the chamber 503, thereby enclosing the chamber 503. For example, the second vacuum pump 121 may be engaged to evacuate the chamber 503 either before the piston 501 is moved into its final position (ready for encapsulation) or else while the piston 501 is being moved into its final position. Additionally, the second set of vacuum holes 117 may be positioned such that the piston 501 may act as a barrier to the second set of vacuum holes 117 once the piston 501 has been moved a certain distance into the chamber 503. For example, the second set of vacuum holes 117 may be positioned a distance $d_6$ of between about 1 mm and about 200 mm away from the bottom unit 507, such as about 10 mm, so that once the piston 501 has been moved to below this distance, the piston 501 will block the second set of vacuum holes 117 and prevent further evacuation of the chamber 503.

However, as one of ordinary skill in the art will recognize, this positioning is merely illustrative, and is not meant to limit the present embodiment in any way. Alternative positionings for the second set of vacuum holes 117, such as the second set of vacuum holes 117 extending through the bottom unit 507 or else extending through the piston 501 itself, similar to the embodiment described above with respect to FIGS. 1A-1B, may also be utilized with the present embodiment. All suitable positionings are fully intended to be included within the scope of the present embodiments.

The piston 501 may be lowered into the chamber 503 until the desired dimensions for the encapsulant 301 are reached, such as about 900 µm to 1500 µm between the semiconductor wafer 101 and the bottom unit 507. Once the piston 501 is in place and the chamber 503 has been evacuated of ambient gasses, the encapsulant 301 may be, for example, injected into the space between the semiconductor wafer 101 and the bottom of the chamber 503. After the encapsulant 301 has been injected or otherwise formed, the encapsulant 301 may be cured as described above with reference to FIG. 3. Once cured, the piston 501 may be removed from the chamber 503, along with the semiconductor wafer 101/semiconductor die 109/encapsulant 301 combination, which remains affixed to the piston 501 through the partial vacuum present in the first set of vacuum holes 115. The removal of the piston 501 and the semiconductor wafer 101/semiconductor die 109/encapsulant 301 may be aided by the release material 127. Once the piston 501 is removed from the chamber 503, the first vacuum pump 119 can be disengaged, thereby allowing the first set of vacuum holes 115 to return to an ambient pressure and release the semiconductor wafer 101/semiconductor die 109/encapsulant from the piston 501.

By using the second set of vacuum holes 117 to evacuate the ambient gasses within the chamber 502, the ambient gasses cannot interact and interfere with the encapsulation process. This ambient gas control can help to prevent flash from accumulating along the backside of the semiconductor wafer 101. Additionally, without the ambient gasses within the chamber 503, the encapsulant 301 can more easily fill areas located between the semiconductor wafer 101 and the semiconductor dies 109, thereby providing better protection from ambient conditions and further processing.

Figure 6A:
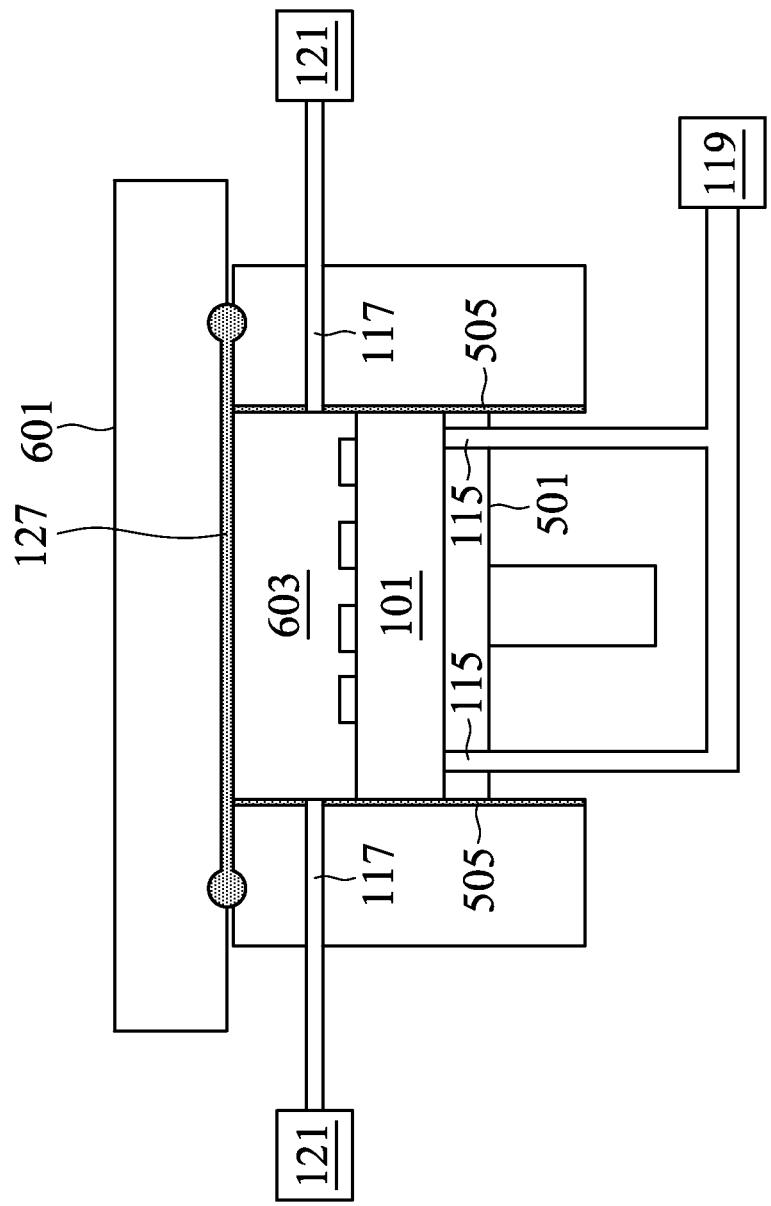
FIGS. 6A-6C illustrate another embodiment in which a piston arrangement is utilized as the molding device.
Figure 6B:
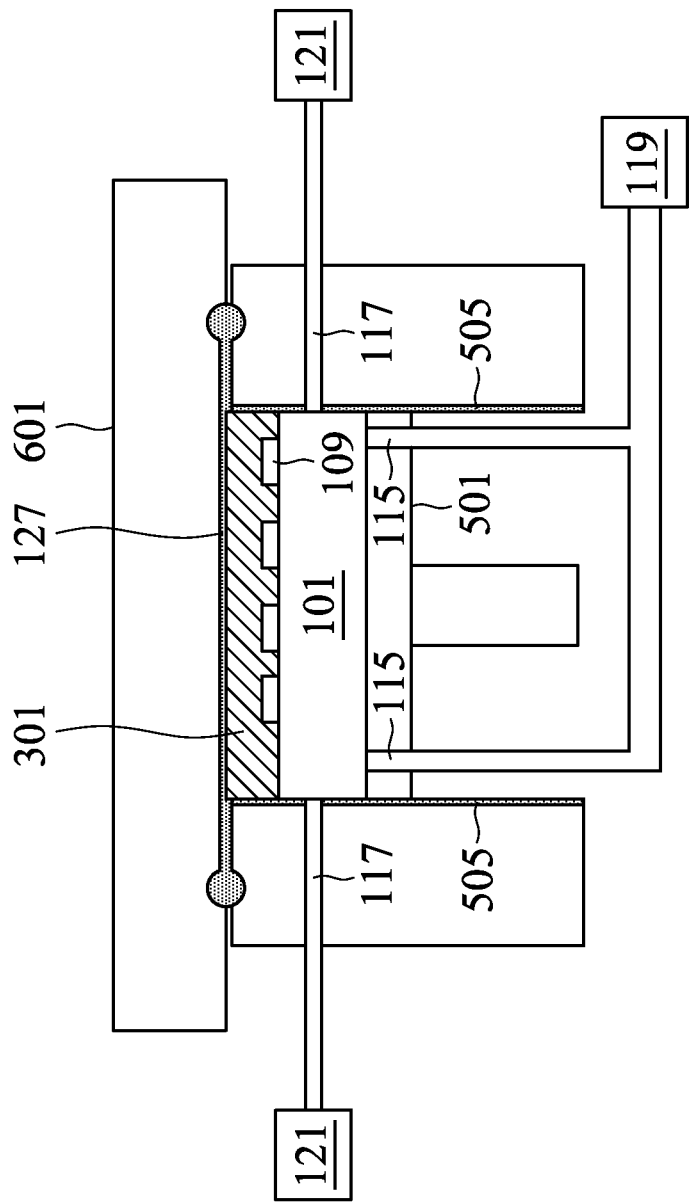
Figure 6C:
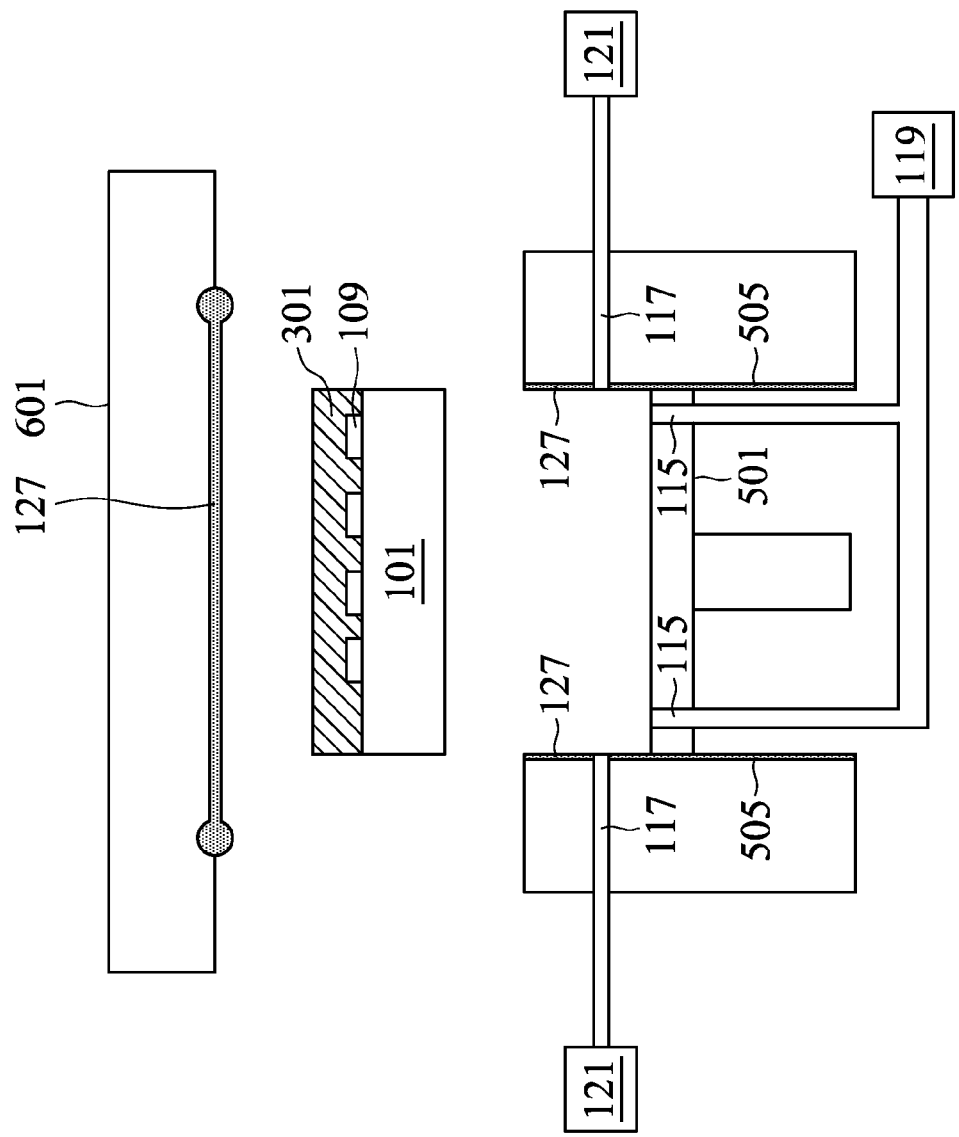

FIGS. 6A-6C illustrate another embodiment which utilizes a top down mold design. In this embodiment, similar to the embodiment described above with respect to FIGS. 5A-5B, the semiconductor wafer 101 is adhered to a piston 501 using the first set of vacuum holes 115. The piston 501 and the semiconductor wafer 101 are inserted into a chamber 603 that can be evacuated using the second set of vacuum holes 117. The chamber 603 of this embodiment, however, is formed using sidewalls 505 attached to a removable top portion 601. The sidewalls 505 may be attached to the removable top portion 601 through the use of, for example, screws, an automatic mechanical compression tool, or any other suitable, non-permanent means of attachment.

FIG. 6B illustrates the placement and curing of the encapsulant 301 in a process similar to the one described above with respect to FIG. 5A-5B. For example, the second vacuum pump 121 may be engaged to evacuate the chamber 503 either before or during the final placement of the piston 501 and semiconductor wafer 101, and the encapsulant 301 is placed into contact with the semiconductor wafer 101 and the semiconductor dies 109. The encapsulant 301 may then be cured in order to harden and provide protection for the semiconductor wafer 101 and the semiconductor dies 109.

FIG. 6C illustrates the removal of the semiconductor wafer 101/semiconductor dies 109/encapsulant 301 combination from the chamber 503. In this embodiment the removable top portion 601 may be removed from the sidewalls 507 and then physically separating the removable top portion 601 from the sidewalls 505. Once the removable top unit 601 has been separated from the sidewalls 505, the semiconductor wafer 101/semiconductor dies 109/encapsulant 301 combination may be removed from the chamber 503 for further processing.

Although the present embodiments and their advantages have been described in detail, it should be understood that various changes, substitutions and alterations can be made herein without departing from the spirit and scope of the embodiments as defined by the appended claims. For example, the precise order of engaging and disengaging the vacuums within the first set of vacuum holes and second set of vacuum holes may be modified.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present embodiments. Accordingly, the appended claims are intended to include within their scope such processes, machines, manufacture, compositions of matter, means, methods, or steps.

What is claimed is:

1. A system for encapsulating a semiconductor device comprising:
   a molding chamber comprising a first variable pressure region, a second variable pressure region, and a semiconductor wafer receiving region located between the first variable pressure region and the second variable pressure region;
   a gas-impermeable material isolating the first variable pressure region from the second variable pressure region where the first variable pressure region is not separated from the second variable pressure region by the semiconductor receiving region;
   at least one first vacuum hole extending through the molding chamber, the at least one first vacuum hole opening to the first variable pressure region; and
   at least one second vacuum hole extending through the molding chamber and located opposite the semiconductor wafer receiving region from the second variable pressure region and operably connected to the second variable pressure region.

2. The system of claim 1, wherein the molding chamber further comprises:
   a top molding portion with a first cavity; and
   a bottom molding portion with a second cavity, the bottom molding portion being separable from the top molding portion, the first cavity being aligned with the second cavity to form the molding chamber.

3. The system of claim 2, further comprising a release material located along sidewalls of the second cavity.

4. The system of claim 3, wherein the release material comprises gold, Cr—N or Teflon.

5. The system of claim 2, wherein the at least one first vacuum hole and the at least one second vacuum hole both extend through the bottom molding portion.

6. The system of claim 5, wherein the gas-impermeable material is located on the bottom molding portion between the at least one first vacuum hole and the at least one second vacuum hole.

7. The system of claim 1, wherein the molding chamber further comprises a bottom molding portion and ejection pins extending through the bottom molding portion.

8. The system of claim 1, wherein the molding chamber further comprises:
   a stationary chamber comprising sidewalls, the at least one second vacuum hole extending through the at least one of the sidewalls; and
   a piston, the at least one first vacuum hole extending through the piston.

9. A system for encapsulating a semiconductor device comprising:
   a mold defined by a top molding portion and a bottom molding portion;
   a first vacuum separator and a second vacuum separator located on one of the bottom molding portion and the top molding portion;
   a first vacuum hole extending through the mold and operably connected to control a first pressure in a first pressure zone, the first pressure zone enclosed by the first vacuum separator; and
   a second vacuum hole extending through the mold and operably connected to control a second pressure in a second pressure zone separately from the first pressure in the first pressure zone, the second pressure zone being connected to the second vacuum hole through openings in the second vacuum separator.

10. The system of claim 9, wherein the first pressure zone is located to affix the semiconductor device.

11. The system of claim 9, wherein the first vacuum hole and the second vacuum hole extend through the bottom molding portion.

12. The system of claim 9, further comprising a release material located along a sidewall of the bottom molding portion.

13. The system of claim 12, wherein the release material is gold, Cr—N or Teflon.

14. The system of claim 9, further comprising ejection pins extending through the one of the bottom molding portion and the top molding portion.

15. A system for encapsulating a semiconductor device comprising:
   an upper molding portion and a lower molding portion;
   a molding chamber located between the upper molding portion and the lower molding portion, the molding chamber comprising:
      a first pressure region adjacent to the lower molding portion; and
      a second pressure region adjacent to the lower molding portion, wherein the second pressure region is isolated from the first pressure region next to the lower molding portion by a first vacuum separator located on the lower molding portion.

16. The system of claim 15, further comprising a second vacuum separator located on the lower molding portion within the second pressure region, the second vacuum separator comprising openings to connect a first section of the second pressure region with a second section of the second pressure region.

17. The system of claim 16, wherein the second pressure region extends to a region over a semiconductor wafer receiving area within the molding chamber.

18. The system of claim 15, further comprising:
   a first vacuum hole operably connected to the first pressure region; and
   a second vacuum hole operably connected to the second pressure region and operably isolated from the first pressure region.

19. The system of claim 15, further comprising ejection pins extending through the lower molding portion.

20. The system of claim 15, further comprising a release material located along sidewalls of the molding chamber.

* * * * *